(12) United States Patent
Maki

(10) Patent No.: US 6,809,038 B2
(45) Date of Patent: Oct. 26, 2004

(54) METHOD OF MANUFACTURING SEMICONDUCTOR DEVICE

(75) Inventor: Tatsuichiro Maki, Kasugai (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/364,449

(22) Filed: Feb. 12, 2003

(65) Prior Publication Data

US 2004/0014328 A1 Jan. 22, 2004

(30) Foreign Application Priority Data

Jul. 16, 2002 (JP) ........................................ 2002-207254

(51) Int. Cl.⁷ ............................................. H01L 21/302
(52) U.S. Cl. ................... 438/714; 438/725; 438/723; 438/724; 438/740; 438/743; 438/744
(58) Field of Search ................... 438/714, 725, 438/723, 724, 740, 743, 744

(56) References Cited

U.S. PATENT DOCUMENTS

| | | | |
|---|---|---|---|
| 4,529,476 A | | 7/1985 | Kawamoto et al. |
| 5,786,276 A | * | 7/1998 | Brooks et al. ............... 438/724 |
| 5,968,846 A | * | 10/1999 | Chou et al. .................. 438/712 |
| 6,033,962 A | * | 3/2000 | Jeng et al. .................. 438/301 |
| 6,461,529 B1 | * | 10/2002 | Boyd et al. .................... 216/67 |

FOREIGN PATENT DOCUMENTS

| | | |
|---|---|---|
| EP | 0 945 896 A1 | 9/1999 |
| JP | 59-222933 | 12/1984 |
| JP | 8-59215 | 3/1996 |
| WO | WO98/16950 | 4/1998 |

* cited by examiner

Primary Examiner—George A. Goudreau
(74) Attorney, Agent, or Firm—Westerman, Hattori, Daniels & Adrian, LLP

(57) ABSTRACT

Formed is a lamination structure of a silicon oxide layer, a silicon nitride layer and a silicon oxide layer as an intermediate insulating film between a floating gate and a control gate. A silicon nitride film above the control gate is removed by dry etching. In this event, $CH_3F$ gas, $CH_2F_2$ gas or a mixed gas thereof and $O_2$ gas are used as an etching gas, a pressure inside a reaction chamber is set in the range of 10.6 to 13.3 Pa (80 to 100 mTorr), and a flow rate of the $O_2$ gas is set five times that of the $CH_3F$ gas, $CH_2F_2$ gas or mixed gas thereof or more.

6 Claims, 19 Drawing Sheets

The ratio of the space required for the film to be etched : 100%

The ratio of the space required for the film to be etched : 70%

The ratio of the space required for the film to be etched : 20% ately, as shown in FIGS. 3A and 3B, a
METHOD OF MANUFACTURING SEMICONDUCTOR DEVICE

CROSS-REFERENCE TO RELATED APPLICATIONS

This application is based upon and claims priority of Japanese Patent Application No. 2002-207254, filed on Jul. 16, 2002, the contents being incorporated herein by reference.

BACKGROUND OF THE INVENTION

1. Field of the Invention

The present invention relates to a method of manufacturing a semiconductor device including a step of dry etching a silicon nitride film selectively, and more particularly to a method of manufacturing a semiconductor device suitable for manufacturing a flash memory.

2. Description of the Prior Art

Referring to FIGS. 1 to 6, a conventional method of manufacturing a NOR-type flash memory will be first described.

FIGS. 1A to 1C are plan views showing, in the order of steps, an example of the conventional method of manufacturing a flash memory; and FIGS. 2 to 6 are cross-sectional views similarly showing the method of manufacturing a flash memory in the order of steps. Note that FIGS. 1A to 1C are plan views of a memory cell formation portion. Moreover, note that FIGS. 2A, 3A, 4A, 5A and 6A illustrate cross-sections of a peripheral circuit formation portion and that FIGS. 2B, 3B, 4B, 5B and 6B illustrate cross-sections taken along the line I—I in FIG. 1A. Moreover, in order to simplify the description, a transverse direction of FIG. 1A will be referred to as an X direction and a longitudinal direction thereof will be referred to as a Y direction.

First, as shown in FIG. 1A, a plurality of trenches arrayed in the X and Y directions are formed on a semiconductor substrate 50. Then, an insulator is buried in the trenches, thus forming an element isolation film 51. Thereafter, as shown in FIGS. 2A and 2B, a silicon oxide film 52 is formed by subjecting a surface of the semiconductor substrate 50 to thermal oxidation.

Next, a conductive polysilicon film 53 is formed on an entire upper surface of the semiconductor substrate 50. Then, the conductive polysilicon film 53 in the memory cell formation portion is patterned, thus forming a plurality of strip-shaped polysilicon films 53 extending in the Y direction as shown in FIG. 1A. These strip-shaped polysilicon films 53 are formed so as to have both side edge portions thereof in their width direction overlap with edge portions of two element isolation films 51 adjacent to each other, respectively.

Next, an intermediate insulating film 54 is formed over the entire upper surface of the semiconductor substrate 50. Thereafter, a photoresist film 57 is formed on this intermediate insulating film 54, and an opening portion is provided in the resist film 57 by executing an exposure/developing process thereto. Accordingly, as shown in FIG. 2A, the intermediate insulating film 54 in the peripheral circuit formation portion is exposed.

Thereafter, by use of the resist film 57 as a mask, the intermediate insulating film 54 and the polysilicon film 53 in the peripheral circuit formation portion are sequentially etched and removed. After completing the etching, the resist film 57 is removed.

After removing the intermediate insulating film 54 and the polysilicon film 53 in the peripheral circuit formation portion as described above, as shown in FIGS. 3A and 3B, a conductive polysilicon film 58 is formed over the entire upper surface of the semiconductor substrate 50, and a silicon oxide film 59 and a silicon nitride film 60 are further formed thereon. Thereafter, on the silicon nitride film 60, a resist film 61 is formed in a predetermined shape. Then, the silicon nitride film 60, silicon oxide film 59, polysilicon films 58 and 58a, intermediate insulating film 54 and polysilicon film 53 are sequentially etched by use of the resist film 61 as a mask. After completing the etching, the resist film 61 is removed.

By this etching, as shown in FIGS. 4A and 4B, a gate electrode 58b made of polysilicon is formed in the peripheral circuit formation portion, and a floating gate 53a and a control gate 58a, which are made of polysilicon, are formed in the memory cell formation portion. As shown in FIG. 1B, the control gate 58a extends in the X direction, and one floating gate 53a is formed for each memory cell.

Next, by use of the silicon nitride film 60 in the memory cell formation portion as a mask, ion implantation of impurities is performed to the surface of the semiconductor substrate 50 via the silicon oxide film 52. Thus, a source layer 62s and a drain layer 62d are formed. As shown in FIG. 1B, the source layer 62s is formed to extend in the X direction, and the drain layer 62d is formed in a region surrounded by the element isolation films 51 and control gates 58a.

Moreover, by use of the silicon nitride film 60 in the peripheral circuit formation portion as a mask, ion implantation of impurities is performed to the surface of the semiconductor substrate 50 via the silicon oxide film 52. As a result, lightly doped drain (LDD) layers 62b are formed on both sides of a gate electrode 58b, respectively.

Thereafter, the silicon nitride film 60 is removed by wet etching using thermal phosphoric acid.

Next, a silicon oxide film is formed over the entire upper surface of the semiconductor substrate 50, and anisotropic etching is carried out thereto. Thus, as shown in FIGS. 5A and 5B, sidewalls 63a are formed respectively on both sides of each floating gate 53a and each control gate 58a in the memory cell formation portion, and sidewalls 63b are formed respectively on both sides of the gate electrode 58b in the peripheral circuit formation portion. Thereafter, by use of the gate electrode 58b and the sidewalls 63b as a mask, ion implantation of impurities at a high density is executed to the substrate surface in the peripheral circuit formation portion. Thus, on both sides of the gate electrode 58b, source/drain layers 64b are formed, respectively.

Next, a metal film is formed over the entire upper surface of the semiconductor substrate 50, and heat treatment is given thereto. Thus, metal atoms in the metal film and silicon atoms of the control gate 58a, gate electrode 58b and source/drain layer 64b are reacted to each other. Accordingly, as shown in FIGS. 6A and 6B, silicide films 65a, 65b and 65c are formed. Thereafter, the non-reacted metal film is removed by etching.

As shown in FIG. 1C, a silicon oxide film is next formed as an interlayer insulating film 66 over the entire upper surface of the semiconductor substrate 50. Then, by photolithography, contact holes 66h are formed, respectively, which reach to the silicide film 65c and the source layer 62s from an upper surface of the interlayer insulating film 66. After that, a metal film is formed over the entire upper surface of the semiconductor substrate 50, and this metal film is patterned. Thus, bit lines 67a extending in the Y direction are formed in the memory cell formation portion, and wirings 67b are formed in the peripheral circuit formation portion. The bit lines 67a are electrically connected to the drain layers 62d in the memory cell formation portion through the contact holes 66h, and the wirings 67b are electrically connected to the source/drain layers 64b in the peripheral circuit formation portion through the contact holes 66h and the silicide films 65c. In such a manner, a flash memory is completed.

However, the inventor of the present application considers that there are problems described below in the conventional semiconductor device manufacturing method described above.

Normally, in order to prevent a leak of an electric charge from the floating gate 53a to the control gate 58a, the intermediate insulating film 54 has, as shown in FIG. 7, a three-layered structure of a first silicon oxide layer 54a, a silicon nitride layer 54b and a second silicon oxide layer 54c.

In the conventional semiconductor device manufacturing method, when the silicon nitride film 60 is removed by wet etching using thermal phosphoric acid, the silicon nitride layer 54b of the intermediate insulating film 54 is inevitably etched (side-etched) in a horizontal direction (see FIG. 7). For this reason, in forming an interlayer insulating film, a hollow space occurs between the floating gate 53a and the control gate 58a, and a parasitic transistor is generated in this space. This parasitic transistor causes changes in a write voltage and a read voltage of a memory cell, and thus reliability of a semiconductor device is lowered.

In order to prevent the side-etching of the silicon nitride layer 54b, dry etching is conceivable instead of the wet etching using thermal phosphoric acid. For example, in Domestic Re-publication of PCT Publication WO98/16950, described is a method of selectively etching a silicon nitride film by setting a mixture ratio of $CH_2F_2$ gas to $O_2$ gas in the range of 0.2 to 0.6.

Moreover, in Japanese Patent Laid-Open No. Hei 8(1996)-59215, described is a method of selectively etching a silicon nitride film by using a mixed gas of $O_2$ gas and either of $CH_3F$ gas and $CH_2F_2$ gas.

However, by use of these dry etching methods, a ratio of an etching rate of the silicon nitride to an etching rate of the silicon oxide (an etching selectivity) is about 4 to 6, which is relatively small. For this reason, when such methods are applied to the above-described step of removing the silicon nitride film 60, the silicon oxide film 52 covering over a lightly doped drain layer 62b in the peripheral circuit formation portion is etched to be reduced in thickness in removing the silicon nitride film 60. Thus, in an extreme case of the above, the surface of the semiconductor substrate 50 is exposed. Accordingly, contamination such as carbon or a carbon compound, which is contained in an etching gas, is introduced into the lightly doped drain layer 62b. As a result, in the silicide film formation step, portions where the silicide film is not formed (circled portions in FIG. 8) occur as shown in FIG. 8, thus resulting in a contact failure.

Moreover, in the conventional method, when the silicon nitride film 60 is removed by etching, the element isolation film 51 is also etched to generate a concave portion as shown in FIG. 9A, thereby increasing an aspect ratio (a/b) between the control gates 58a. Therefore, as shown in FIG. 9B, in forming the interlayer insulating film 66, an insulator is not completely buried in the concave portion between the control gates 58a, thus generating a hollow space (a so-called "pore") 69. As a result, a write voltage and a read voltage of a memory cell are changed, and thus reliability of a semiconductor device is lowered.

SUMMARY OF THE INVENTION

In consideration of the above, an object of the present invention is to provide a method of manufacturing a semiconductor device in which an etching rate of a silicon nitride is increased compared to an etching rate of a silicon oxide.

The method of manufacturing a semiconductor device is the one including the steps of forming a silicon oxide film and a silicon nitride film above a semiconductor substrate and of dry etching the silicon nitride film, wherein the silicon nitride film is etched by using $CH_3F$ gas, $CH_2F_2$ gas or a mixed gas thereof and $O_2$ gas as an etching gas, by setting a pressure inside a reaction chamber in the range of 10.6 to 13.3 Pa (80 to 100 mTorr), and by setting a flow rate of the $O_2$ gas to be five times that of the $CH_3F$ gas, $CH_2F_2$ gas or mixed gas thereof or more.

Therefore, an etching selectivity of the silicon nitride film with respect to the silicon oxide film increases as much as 15 or more, thus enabling the silicon nitride film to be etched while hardly etching the silicon oxide film.

DESCRIPTION OF THE PREFERRED EMBODIMENT

Hereinafter, an embodiment of the present invention will be described further in detail.

In order to remove a silicon nitride film in an uppermost layer while preventing side-etching of a silicon nitride layer of an intermediate insulating film, the inventor of the present application conducted various experiments and studies in manufacturing a flash memory.

As described above, by wet etching using thermal phosphoric acid, the silicon nitride layer of the intermediate insulating film is side-etched when the silicon nitride film in the uppermost layer is removed. Meanwhile, by a conventional dry etching method using $O_2$ gas and either of $CH_3F$ gas and $CH_2F_2$ gas, though the side-etching of the silicon nitride layer of the intermediate insulating film can be prevented, a silicon oxide film covering a surface of a semiconductor substrate is etched. Thus, contamination such as carbon or a carbon compound, which is contained in an etching gas, is introduced into the surface of the semiconductor substrate.

In order to prevent the introduction of carbon or of its compound into the semiconductor substrate, it is necessary to etch the silicon nitride film under the condition where an etching selectivity of the silicon nitride film with respect to the silicon oxide film is larger.

The inventors of the present application and the like used a magnetron etching device of a parallel plane type and variously changed a ratio of a space required for a film to be etched (silicon nitride film or silicon oxide film), a pressure inside a reaction chamber, a flow rate of an etching gas and an electric power to be applied to the film to be etched. Thus, the inventors of the present application and the like measured an etching rate of the silicon nitride film and an etching rate of the silicon oxide film and calculated an etching selectivity (the etching rate of the silicon nitride film/the etching rate of the silicon oxide film).

Figure 1A:
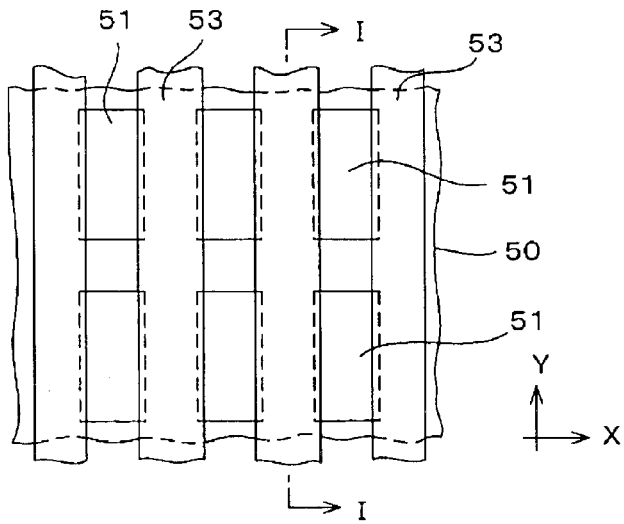
FIGS. 1A to 1C are plan views showing, in the order of steps, an example of a conventional method of manufacturing a semiconductor device (flash memory).
Figure 1B:
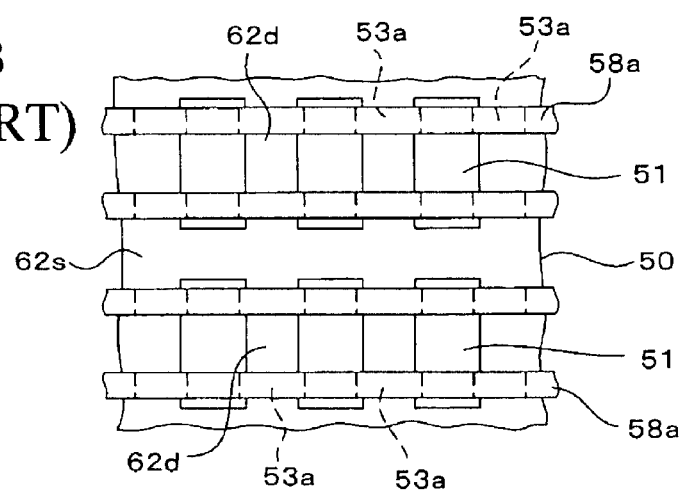
Figure 1C:
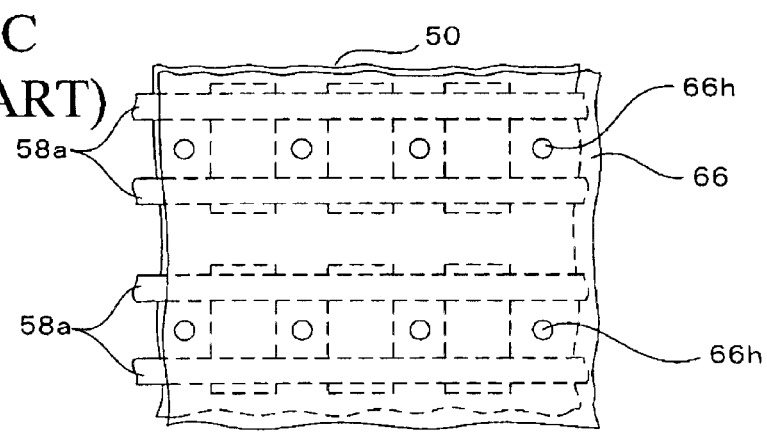
Figure 2A:
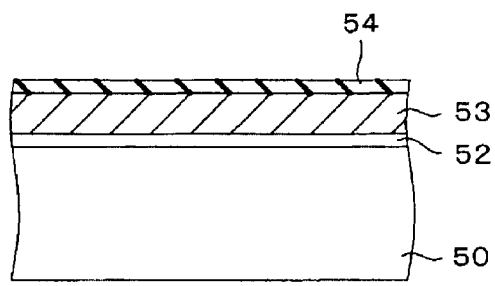
FIGS. 2A and 2B are cross-sectional views (Step 1) showing the conventional method of manufacturing a semiconductor device (flash memory).
Figure 2B:
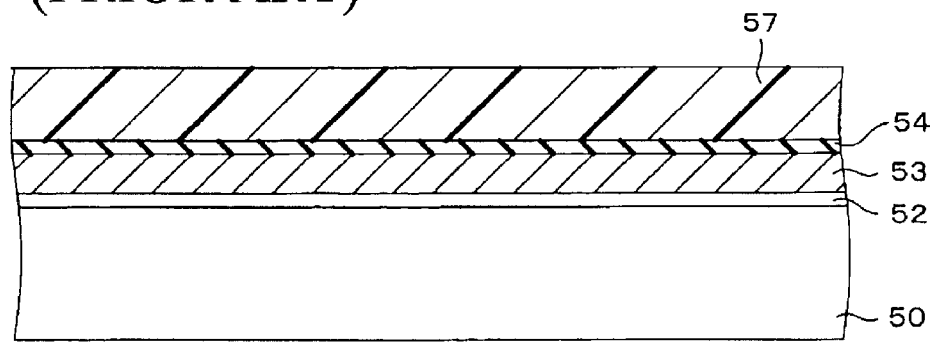
Figure 3A:
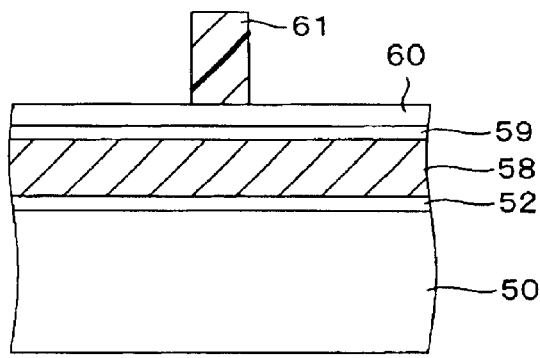
FIGS. 3A and 3B are cross-sectional views (Step 2) showing the conventional method of manufacturing a semiconductor device (flash memory).
Figure 3B:
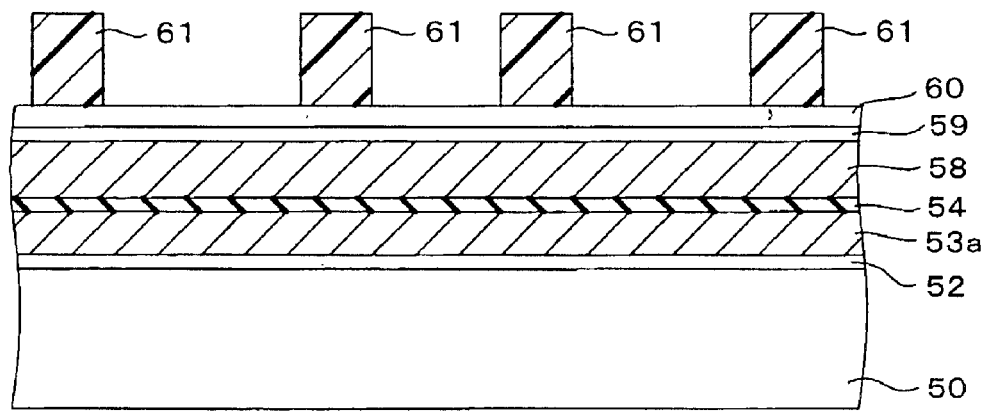
Figure 4A:
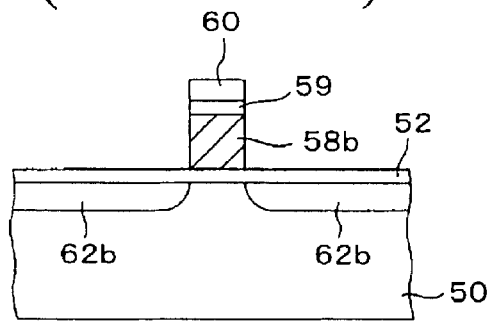
FIGS. 4A and 4B are cross-sectional views (Step 3) showing the conventional method of manufacturing a semiconductor device (flash memory).
Figure 4B:
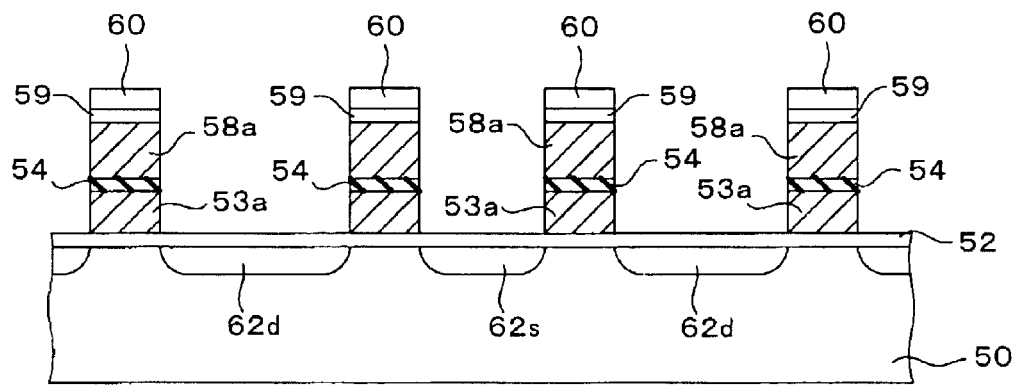
Figure 5A:
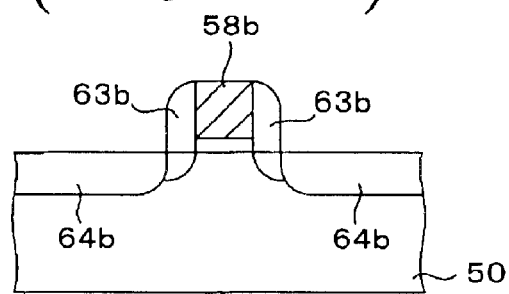
FIGS. 5A and 5B are cross-sectional views (Step 4) showing the conventional method of manufacturing a semiconductor device (flash memory).
Figure 5B:
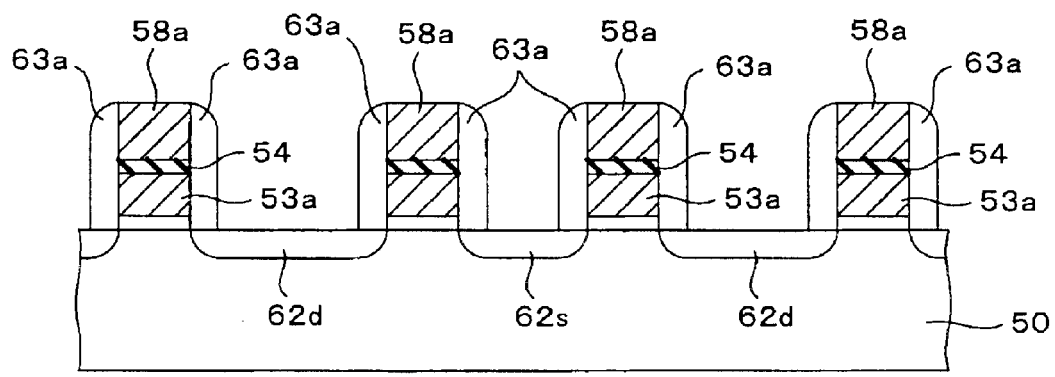
Figure 6A:
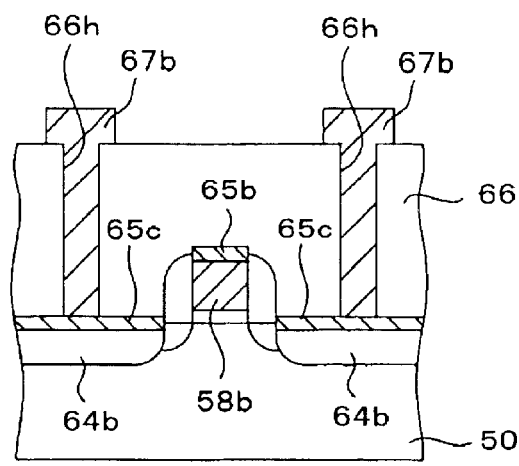
FIGS. 6A and 6B are cross-sectional views (Step 5) showing the conventional method of manufacturing a semiconductor device (flash memory).
Figure 6B:
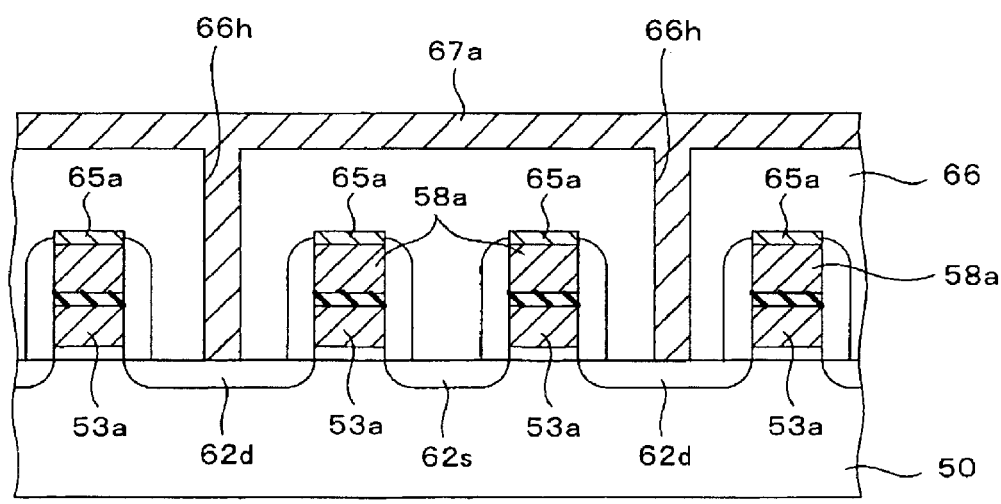
Figure 7:
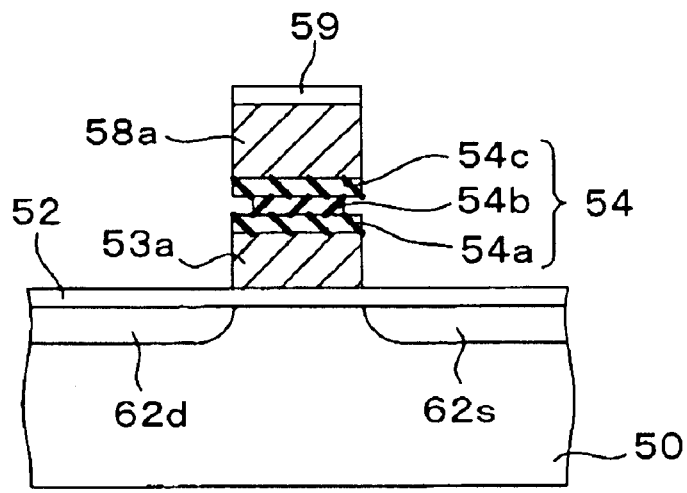
FIG. 7 is a view (No. 1) showing a problem in the conventional method of manufacturing a semiconductor device (flash memory).
Figure 8:
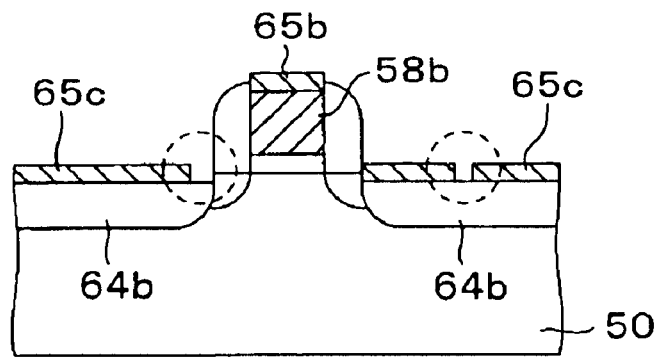
FIG. 8 is a view (No. 2) showing a problem in the conventional method of manufacturing a semiconductor device (flash memory).
Figure 9A:
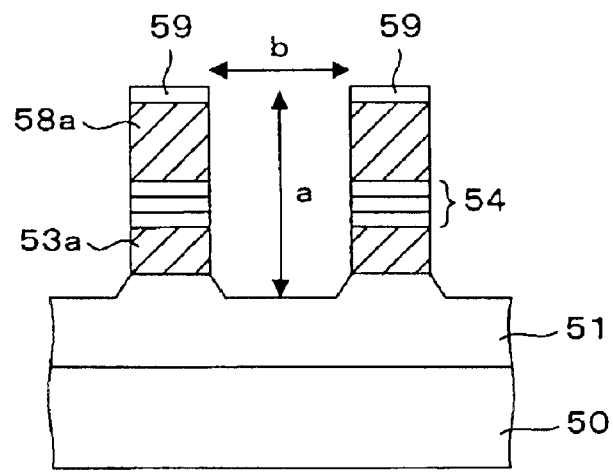
FIG. 9 is a view (No. 3) showing a problem in the conventional method of manufacturing a semiconductor device (flash memory).
Figure 9B:
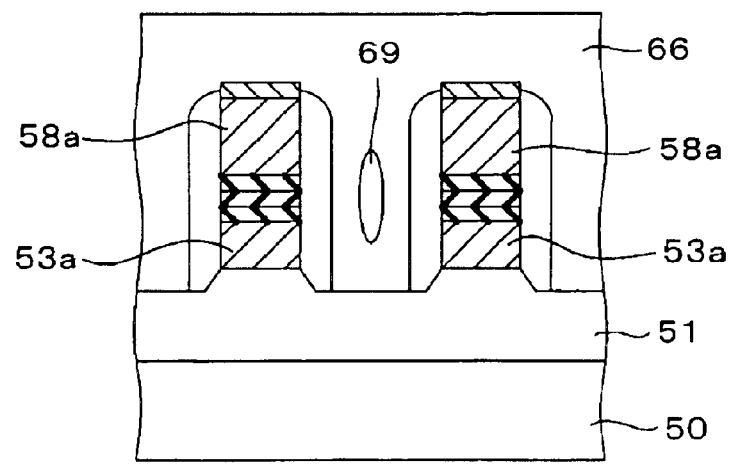
Figure 10:
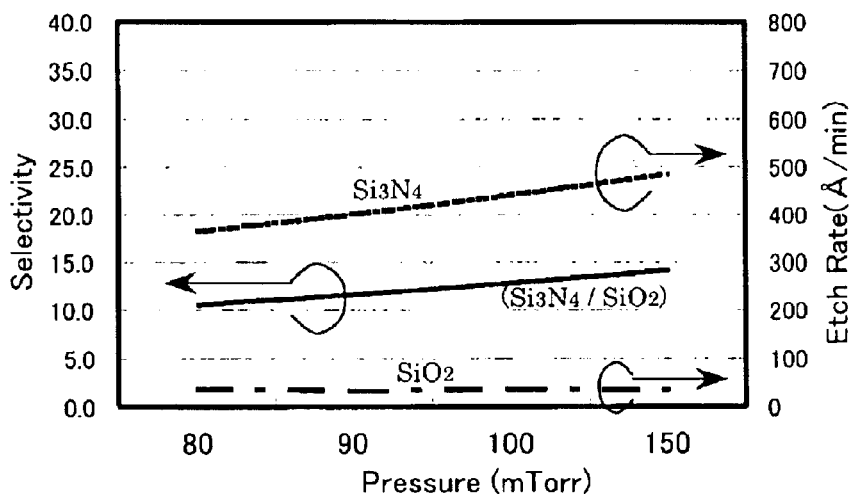
FIG. 10 is a graph showing a relationship between a pressure inside a reaction chamber and each of etching rates and an etching selectivity, when a ratio of a space required for a film to be etched is 100%.
Figure 11:
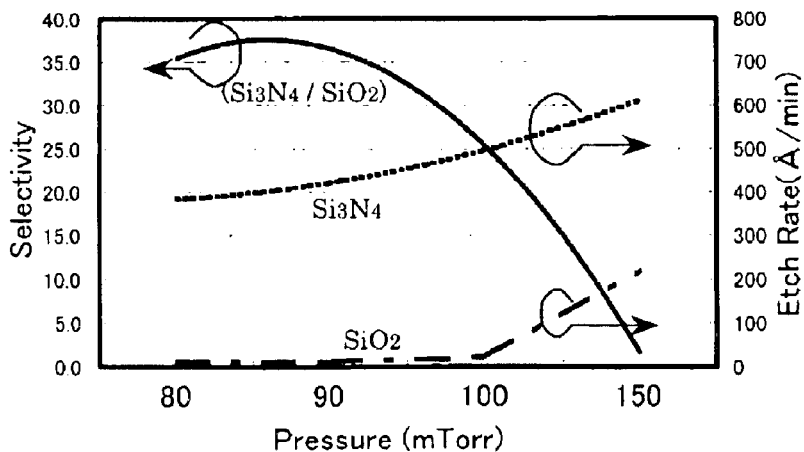
FIG. 11 is a graph showing the relationship between the pressure inside the reaction chamber and each of the etching rates and the etching selectivity, when the ratio of the space required for the film to be etched is 70%.
Figure 12:
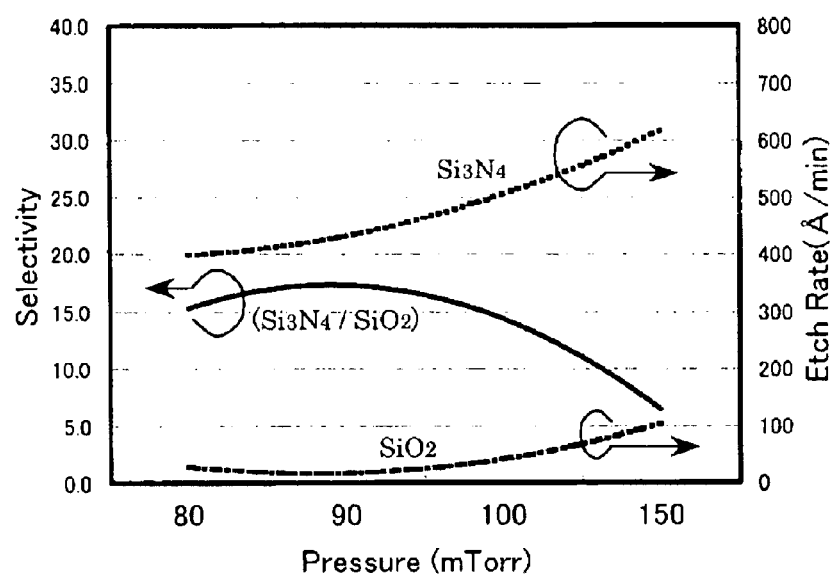
FIG. 12 is a graph showing the relationship between the pressure inside the reaction chamber and each of the etching rates and the etching selectivity, when the ratio of the space required for the film to be etched is 20%.

FIG. 10 is a graph showing a relationship between a pressure inside a reaction chamber (Pressure) and each of etching rates and an etching selectivity (Selectivity), when a ratio of a space required for a film to be etched is 100% (a so-called blank wafer). FIG. 11 is a graph showing the relationship between the pressure inside the reaction chamber and each of the etching rates and the etching selectivity, when the ratio of the space required for the film to be etched is 70%. FIG. 12 is a graph showing the relationship between the pressure inside the reaction chamber and each of the etching rates and the etching selectivity, when the ratio of the space required for the film to be etched is 20%. In any case, an abscissa axis indicates the pressure inside the reaction chamber, an ordinate axis on the left side indicates the selectivity, and an ordinate axis on the right side indicates the etching rates of the silicon nitride ($Si_3N_4$) film and the silicon oxide ($SiO_2$) film. Moreover, an electric power per unit area, which is applied to the film to be etched, is 0.637 W/cm$^2$, and a mixed gas of $CH_3F$ gas and $O_2$ gas is used as the etching gas. Flow amounts of $CH_3F$ gas and $O_2$ gas are 30 sccm and 180 sccm, respectively, and a preset temperature of a wafer stage is 25° C.

As shown in FIG. 10, in the case of a wafer in which the ratio of the space required for the film to be etched is 100%, even if the pressure changes, the etching rate of the silicon oxide film hardly changes. Moreover, though the etching rate of the silicon nitride film linearly changes along with rise in the pressure, a proportion of the change is small. Therefore, though the etching selectivity of the silicon nitride film to the silicon oxide film linearly changes along with the rise in the pressure, a change amount thereof is small, and thus the selectivity cannot be set to 15 or more.

As shown in FIG. 11, in the case of a wafer in which the ratio of the space required for the film to be etched is 70%, the etching rate of the silicon nitride film changes relatively significantly along with the rise in the pressure. Meanwhile, the etching rate of the silicon oxide film hardly changes when the pressure is about 100 mTorr (13.3 Pa) or less, but increases along with the rise in the pressure when the pressure exceeds about 100 mTorr. As a result, the etching selectivity of the silicon nitride film to the silicon oxide film shows a curve having its maximum when the pressure is in the range of 85 to 90 mTorr (11.3 to 12.0 Pa).

As shown in FIG. 12, in the case of a wafer in which the ratio of the space required for the film to be etched is 20%, the etching rate of the silicon oxide film changes corresponding to a curve having its minimum when the pressure is about 90 mTorr (12.0 Pa). Moreover, the etching rate of the silicon nitride film increases in a shape of a curve along with the rise in the pressure. Also in this case, the etching selectivity of the silicon nitride film to the silicon oxide film shows a curve having its maximum when the pressure is about 90 mTorr.

From the results described above, it was proved that the selectivity of the silicon nitride film to the silicon oxide film can be set as large as 15 or more by setting the ratio of the space required for the film to be etched in the range of 20 to 70% and by maintaining the pressure during the etching in the range of 80 to 100 mTorr (10.6 to 13.3 Pa).

Note that, when the flow rate of $O_2$ gas is less than five times that of $CH_3F$ gas, $CH_2F_2$ gas or the mixed gas thereof, uniformity of the etching rates deteriorates, which is thus unpractical. Therefore, it is necessary to set the flow rate of $O_2$ gas to be five times that of $CH_3F$ gas, $CH_2F_2$ gas or the mixed gas thereof or more. It should be noted that, when the flow rate of $O_2$ gas is more than seven times that of $CH_3F$ gas, $CH_2F_2$ gas or the mixed gas thereof, a desired etching selectivity becomes hard to be obtained.

Incidentally, in Japanese Patent Laid-Open No. Sho 59(1984)-222933, described is a method of selectively etching a silicon nitride film with respect to a silicon oxide film by using any one of $CH_3F$ gas and $CH_2F_2$ gas as an etching gas. However, though this method is effective when a power of a high-frequency power source is high, an etching selectivity of the silicon nitride film to the silicon oxide film becomes small when the power of the high-frequency power source is as low as about 200 W. It is not preferable that the power of the high-frequency power source during etching is high, because an introduction amount of carbon, its compound and the like into a semiconductor substrate increases.

On the other hand, in the present invention, the etching selectivity of the silicon nitride film to the silicon oxide film can be set to 15 or more even in the following setting. Specifically, in consideration for a step of subjecting an active area (source/drain layer) or an upper portion of a gate electrode after the removal of the silicon nitride film to silicidation, a power of a high-frequency power source for etching is set, for example, as low as 0.637 $W/cm^2$ (about 200 W in the case of a 8-inch wafer) in order to suppress an introduction amount of carbon, its compound and the like into a silicon substrate or a polysilicon film (gate electrode) due to dry etching to a minimum.

In the present invention, by setting the power of the high-frequency power source for etching as low as 0.478 to 0.796 $W/cm^2$, the introduction of carbon, its compound and the like into the semiconductor substrate and the polysilicon film is suppressed. Thus, though the present invention is suitable for a step of removing a silicon nitride film on a control gate of a flash memory, it is needless to say that the present invention may be applied to other steps and to manufacturing of devices other than the flash memory.

Hereinafter, description will be made for an embodiment in which the present invention is applied to manufacturing of a flash memory.

Figure 13A:
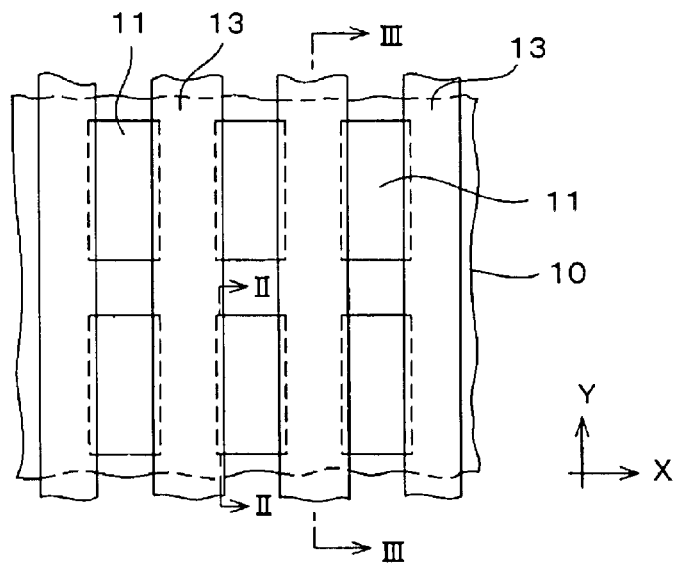
FIGS. 13A to 13C are plan views showing, in the order of steps, a method of manufacturing a semiconductor device (flash memory) according to an embodiment of the present invention.
Figure 13B:
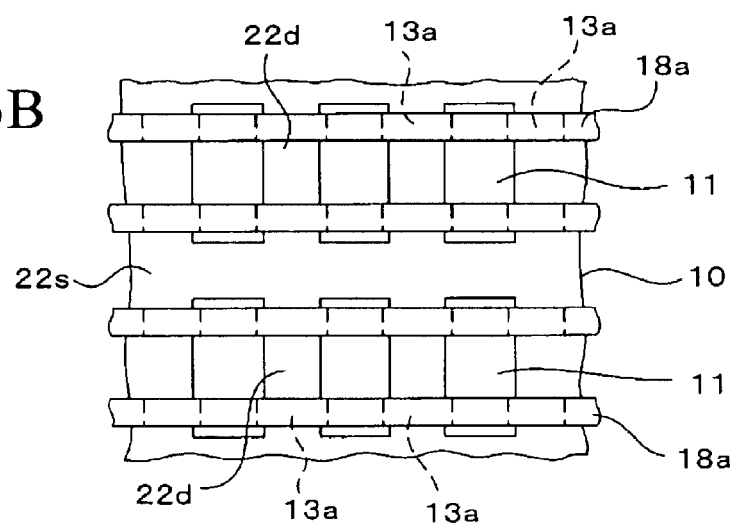
Figure 13C:
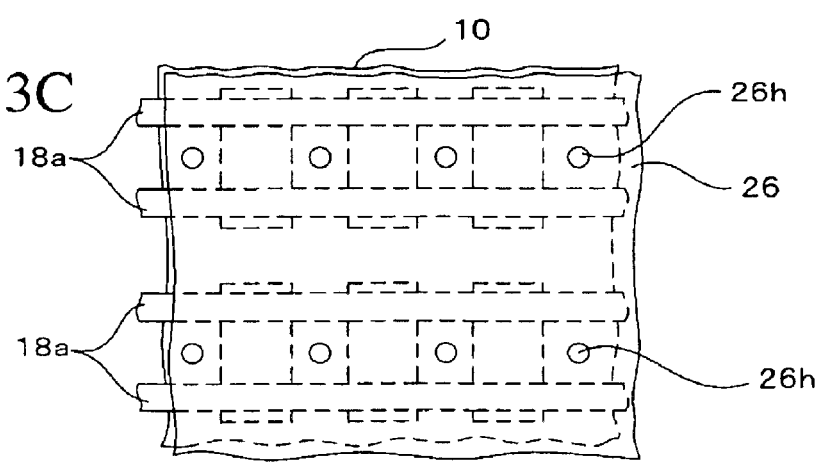

FIGS. 13A to 13C are plan views showing, in the order of steps, a method of manufacturing a semiconductor device (flash memory) according to the embodiment of the present invention. FIGS. 14 to 21 are cross-sectional views similarly showing the manufacturing method in the order of steps. Note that FIGS. 13A to 13C are plan views of a memory cell formation portion. Moreover, FIGS. 14A, 15A, 16A, 17A, 18A, 19A, 20A and 21A show cross-sections in a peripheral circuit portion; FIGS. 14B, 15B, 16B, 17B, 18B, 19B, 20B and 21B show cross-sections taken along the line II—II in FIG. 13A; and FIGS. 14C, 15C, 16C, 17C, 18C, 19C, 20C and 21C show cross-sections taken along the line III—III in FIG. 13A. In order to simplify the description, a transverse direction of FIG. 13A will be referred to as an X direction and a longitudinal direction thereof will be referred to as a Y direction.

First, as shown in FIG. 13A and FIGS. 14A to 14C, a plurality of trenches arrayed in the X and Y directions are formed on a semiconductor substrate 10 by use of a photo-lithography method. Thereafter, an insulator such as $SiO_2$ is filled in the trenches by a CVD method, thus forming an element isolation film 11 for separating element regions. A thickness of the element isolation film 11 is, for example, 200 nm or more.

Next, the surface of the semiconductor substrate 10 is subjected to thermal oxidation, thus forming a silicon oxide film 12. A thickness of this silicon oxide film 12 is, for example, 8 to 12 nm.

Thereafter, by the CVD method, a conductive polysilicon film is formed over an entire upper surface of the semiconductor substrate 10 in a thickness of, for example, 80 to 100 nm. Then, by patterning the polysilicon film by the photolithography method, a plurality of strip-shaped polysilicon films 13 extending in the Y direction are formed as shown in FIG. 13A. These strip-shaped polysilicon films 13 are formed so as to have both side edge portions thereof in their width direction overlap with edge portions of two element isolation films 11 adjacent to each other, respectively.

Figure 14A:
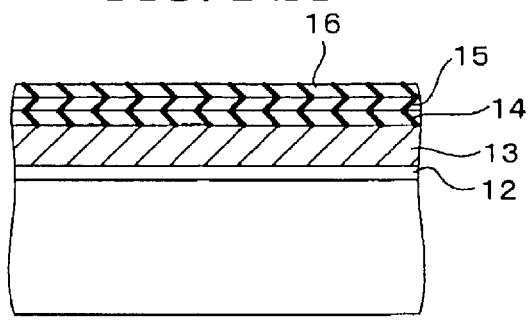
FIGS. 14A to 14C are cross-sectional views (Step 1) showing the method of manufacturing a semiconductor device (flash memory) according to the embodiment of the present invention.
Figure 14B:
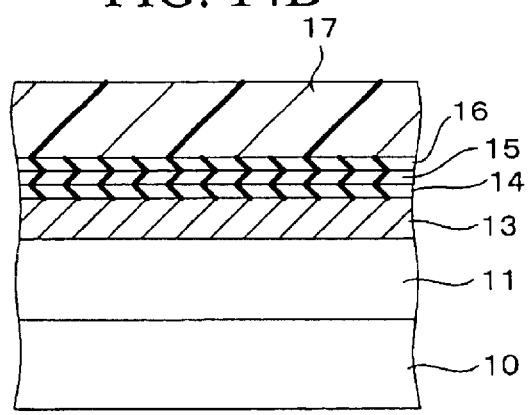
Figure 14C:
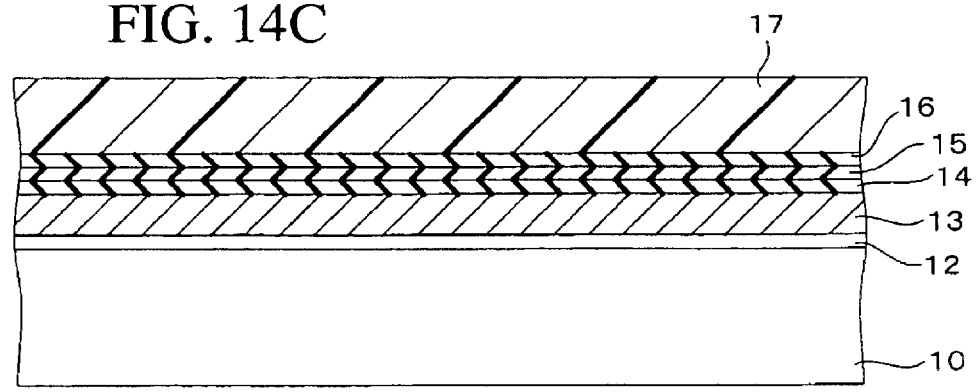

Next, as shown in FIGS. 14A to 14C, an intermediate insulating film having a three-layered structure composed of a silicon oxide layer 14, a silicon nitride layer 15 and a silicon oxide layer 16 is formed over the entire upper surface of the semiconductor substrate 10. A thickness of the silicon oxide layer 14 is, for example, 5 to 7 nm; a thickness of the silicon nitride layer 15 is, for example, 7 to 11 nm; and a thickness of the silicon oxide layer 16 is, for example, 5 to 7 nm.

Thereafter, a photoresist film 17 is formed on the silicon oxide layer 16, and an exposure/developing process is executed thereto, thereby exposing the silicon oxide layer 16 in the peripheral circuit formation portion (see FIG. 14A).

Figure 15A:
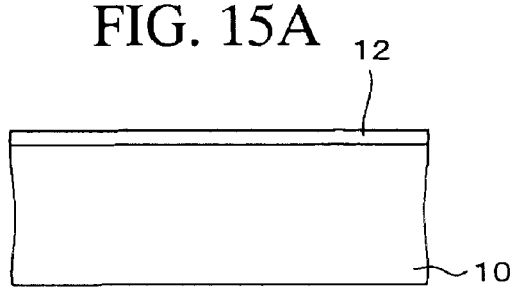
FIGS. 15A to 15C are cross-sectional views (Step 2) showing the method of manufacturing a semiconductor device (flash memory) according to the embodiment of the present invention.
Figure 15B:
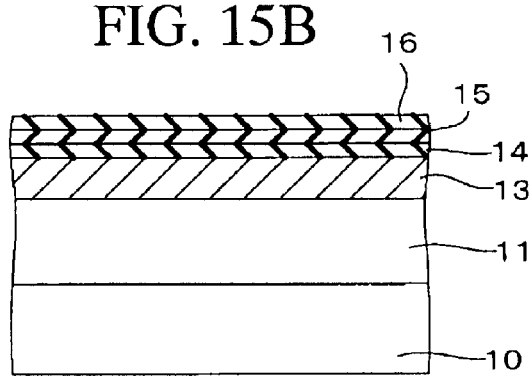
Figure 15C:
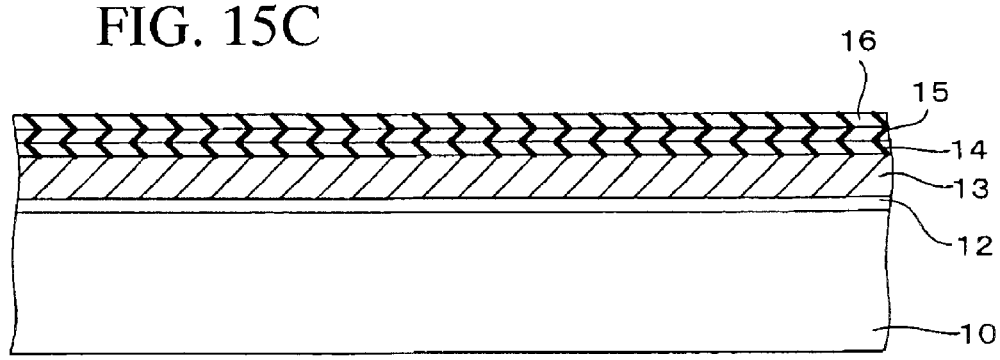

By using the resist film 17 as a mask, the silicon oxide layer 16, silicon nitride layer 15, silicon oxide layer 14 and polysilicon film 13 in the peripheral circuit formation portion are sequentially etched and removed as shown in FIGS. 15A to 15C. After the etching is completed, the resist film 17 is removed.

Figure 16A:
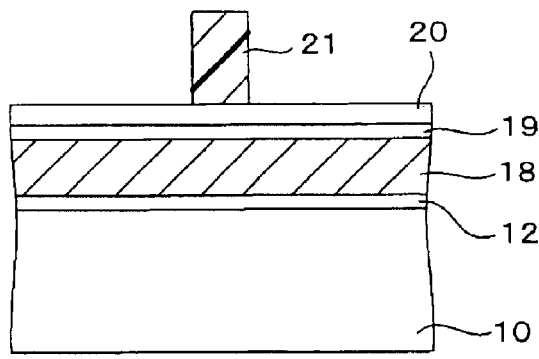
FIGS. 16A to 16C are cross-sectional views (Step 3) showing the method of manufacturing a semiconductor device (flash memory) according to the embodiment of the present invention.
Figure 16B:
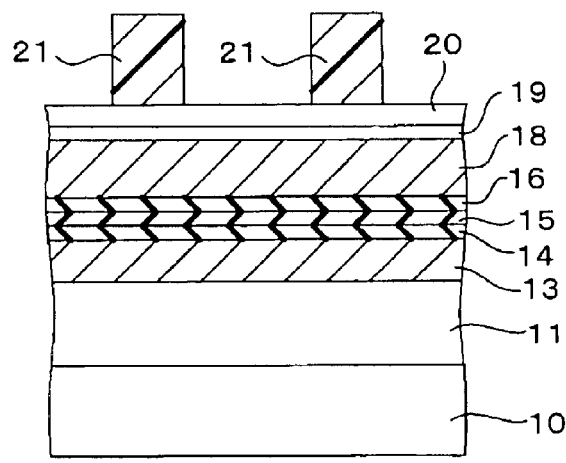
Figure 16C:
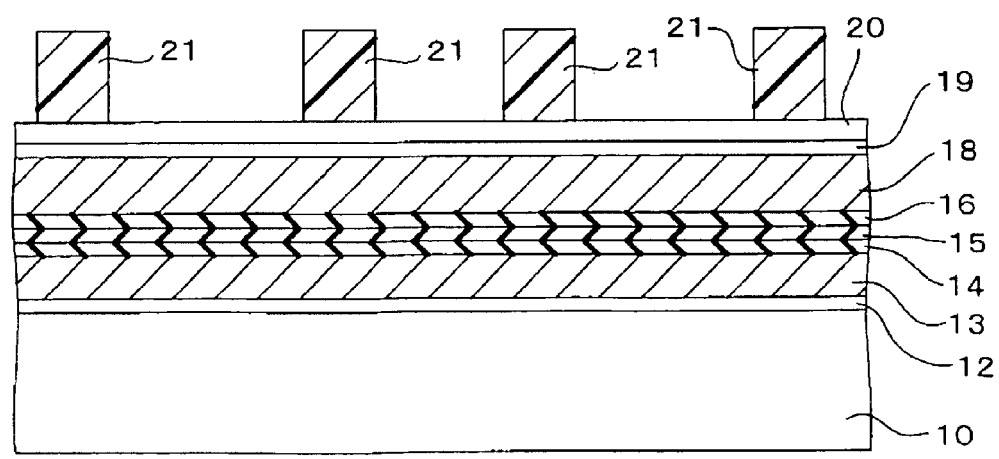

Next, as shown in FIGS. 16A to 16C, by the CVD method, a conductive polysilicon film 18 is formed over the entire upper surface of the semiconductor substrate 10, and a silicon oxide film 19 and a silicon nitride film 20 are further formed thereon. A thickness of the polysilicon film 18 is, for example, 200 to 300 nm; a thickness of the silicon oxide film 19 is, for example, 10 to 30 nm; and a thickness of the silicon nitride film 20 is, for example, 20 to 50 nm. Thereafter, on the silicon nitride film 20, a resist film 21 is formed in a predetermined shape.

By using the resist film 21 as a mask, the silicon nitride film 20, the silicon oxide film 19, the polysilicon film 18, the silicon oxide layer 14, the silicon nitride layer 15, the silicon oxide layer 16 and the polysilicon film 13 are sequentially etched. After the etching is completed, the resist film 21 is removed. In this step, thermal phosphoric acid, for example, is used for etching the silicon nitride film 20 and the silicon nitride layer 15, and hydrofluoric acid, for example, is used for etching the silicon oxide film 19 and the silicon oxide layers 14 and 16.

Figure 17A:
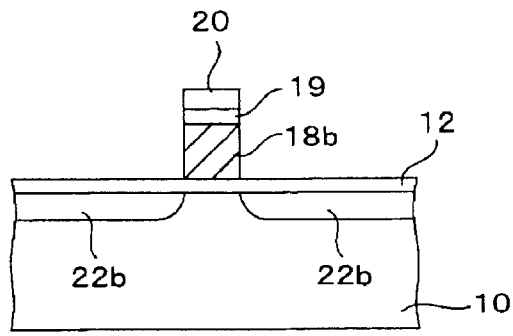
FIGS. 17A to 17C are cross-sectional views (Step 4) showing the method of manufacturing a semiconductor device (flash memory) according to the embodiment of the present invention.
Figure 17B:
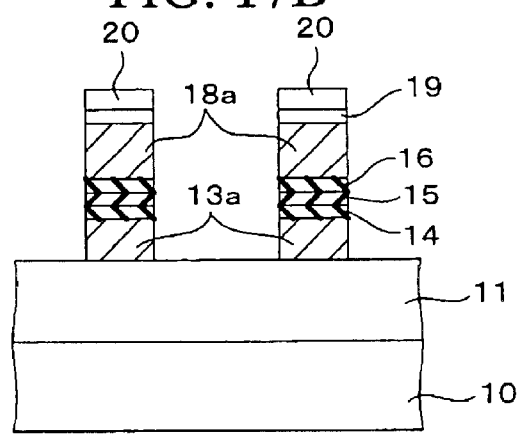
Figure 17C:
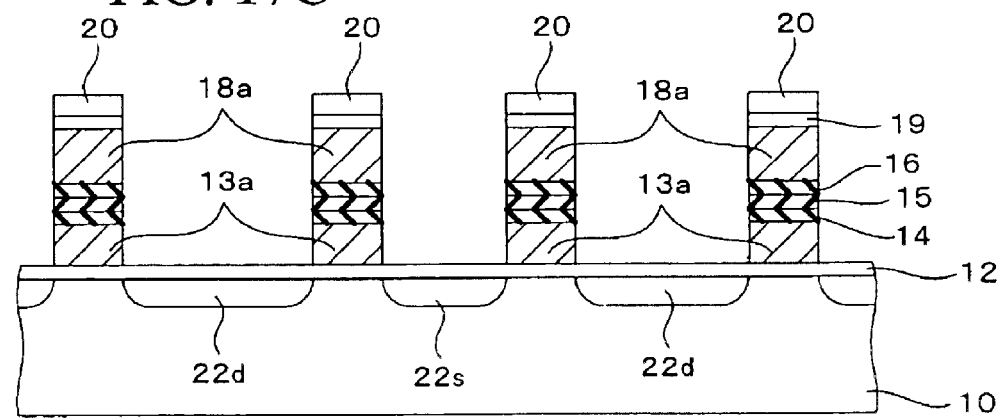

By this etching, as shown in FIGS. 17A to 17C, a gate electrode 18b made of polysilicon is formed in the peripheral circuit formation portion, and a floating gate 13a and a control gate 18a, which are made of polysilicon, are formed in the memory cell formation portion. As shown in FIG. 13B, the control gate 18a extends in the Y direction, and one floating gate 13a is formed for each memory cell.

Thereafter, ion-implantation of n-type impurities such as phosphorous (P) is performed to the semiconductor substrate surface via the silicon oxide film 12 by using the silicon nitride film 20 in the memory cell formation portion as a mask, thus forming a source layer 22s and a drain layer 22d. As shown in FIG. 13B, the source layer 22s is formed to extend in the X direction, and the drain layer 22d is formed in the region surrounded by the element isolation films 11 and the control gates 18a.

Moreover, ion-implantation of n-type impurities or p-type impurities is performed to the substrate surface via the silicon oxide film 12 by using the silicon nitride film 20 in the peripheral circuit formation portion as a mask, and thus lightly doped drain layers (LDD layer) 22b are formed on the both sides of the gate electrode 18b, respectively.

Next, the silicon nitride film 20 is etched and removed. According to the embodiment, the silicon nitride film 20 is dry-etched under the following condition in this step. Specifically, a mixed gas of $O_2$ and either of $CH_3F$ and $CH_2F_2$ is used as an etching gas, a pressure inside a reaction chamber is controlled to be in the range of 80 to 100 mTorr (10.6 to 13.3 Pa) and a flow rate of $O_2$ is set to be 5 to 7 times greater than that of $CH_3F$ or $CH_2F_2$. Moreover, a ratio of a space required for the silicon nitride film 20, which is a film to be etched, is in the range of 20 to 70%.

When the dry etching is performed under the above condition, the silicon nitride film 20 is etched in the vertical direction, and thus there is no risk of side-etching the silicon nitride layer 15 of the intermediate insulating film. Moreover, since the etching rate of the silicon nitride is sufficiently large compared to the etching rate of the silicon oxide, reduction in the film thickness of the silicon oxide film 12 due to etching is avoided. Therefore, carbon, its compound and the like in the etching gas is not introduced into the semiconductor substrate 10, and thus a silicide film can be uniformly formed in a silicide film formation step to be described later.

Figure 18A:
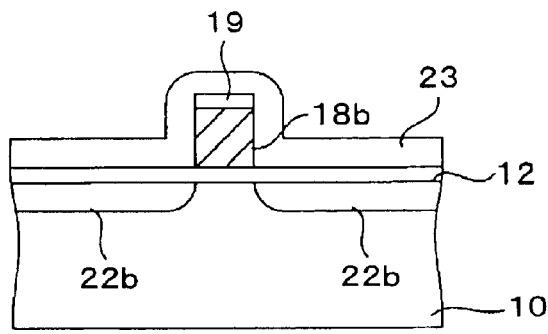
FIGS. 18A to 18C are cross-sectional views (Step 5) showing the method of manufacturing a semiconductor device (flash memory) according to the embodiment of the present invention.
Figure 18B:
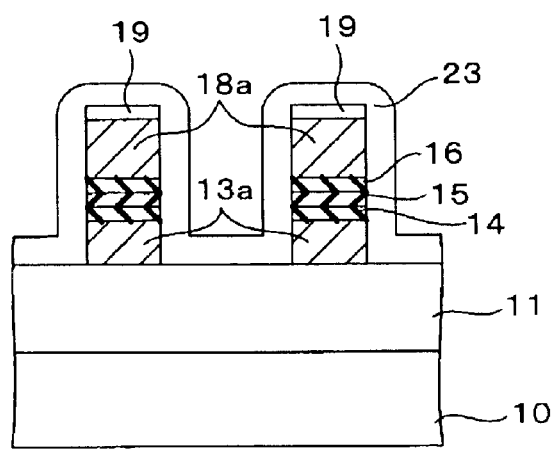
Figure 18C:
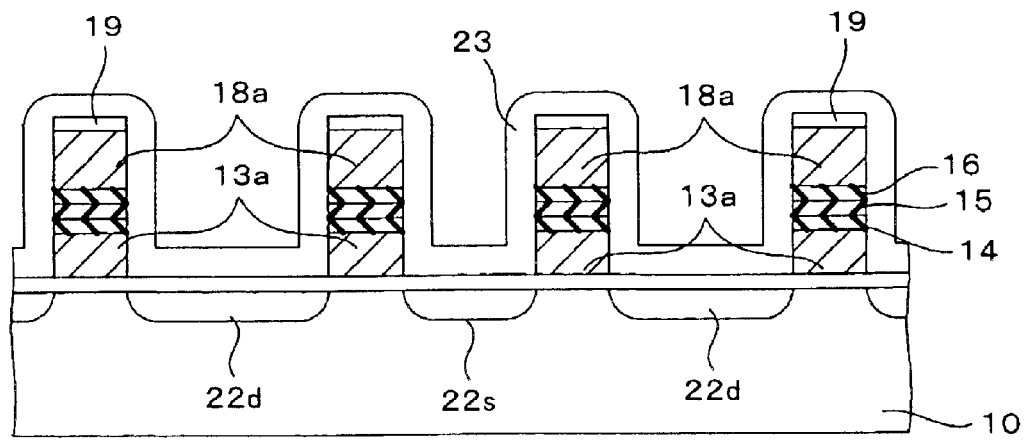
Figure 19A:
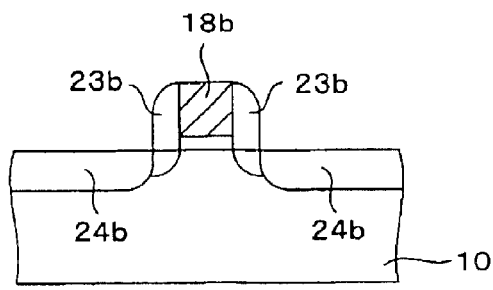
FIGS. 19A to 19C are cross-sectional views (Step 6) showing the method of manufacturing a semiconductor device (flash memory) according to the embodiment of the present invention.
Figure 19B:
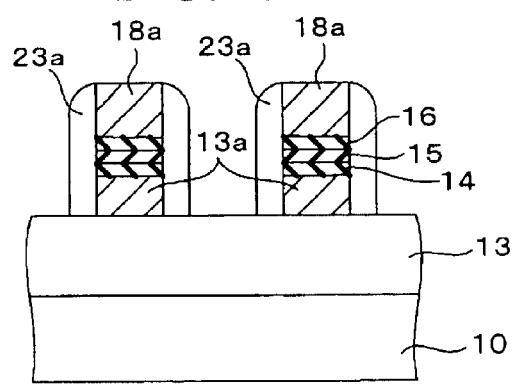
Figure 19C:
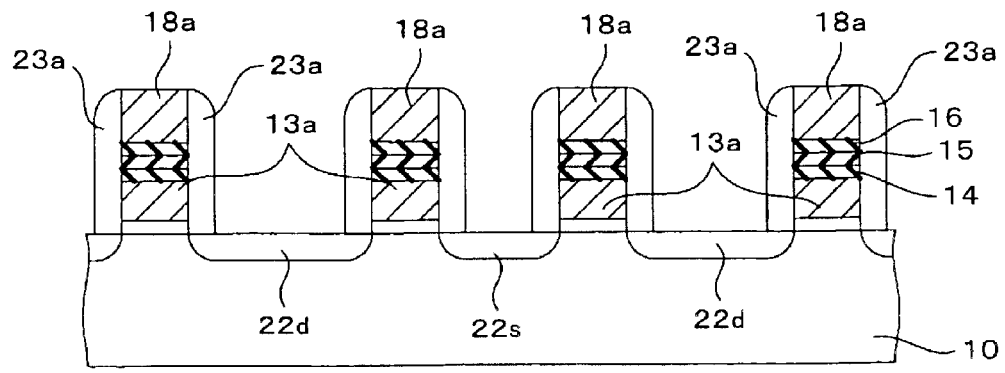

Next, as shown in FIGS. 18A to 18C, a silicon oxide film 23 is formed over the entire upper surface of the semiconductor substrate 10. Then, this silicon oxide film is subjected to anisotropic etching, and as shown in FIGS. 19A to 19C, sidewalls 23a are formed on the sides of the floating gate 13a and control gate 18a in the memory cell formation portion, and sidewalls 23b are formed on the sides of the gate electrode 18b in the peripheral circuit formation portion. Thereafter, by using the gate electrode 18b and the sidewalls 23b as a mask, ion-implantation of impurities having the same conductivity as that of the lightly doped drain layer 22b is performed at a high concentration to the substrate surface in the peripheral circuit formation portion. Thus, a source/drain layer 24b is formed.

Figure 20A:
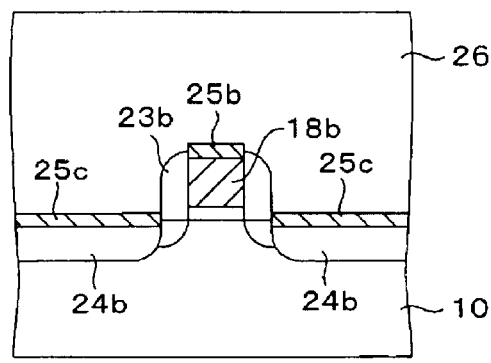
FIGS. 20A to 20C are cross-sectional views (Step 7) showing the method of manufacturing a semiconductor device (flash memory) according to the embodiment of the present invention.
Figure 20B:
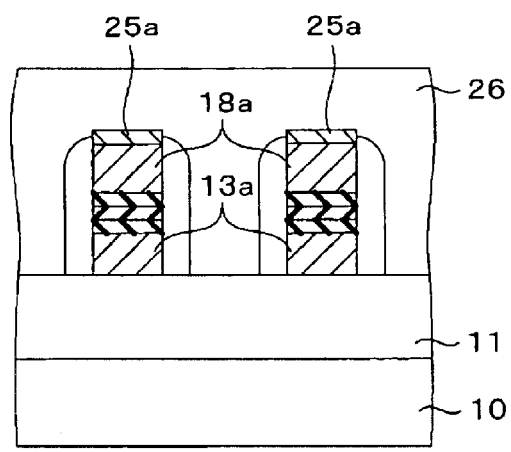
Figure 20C:
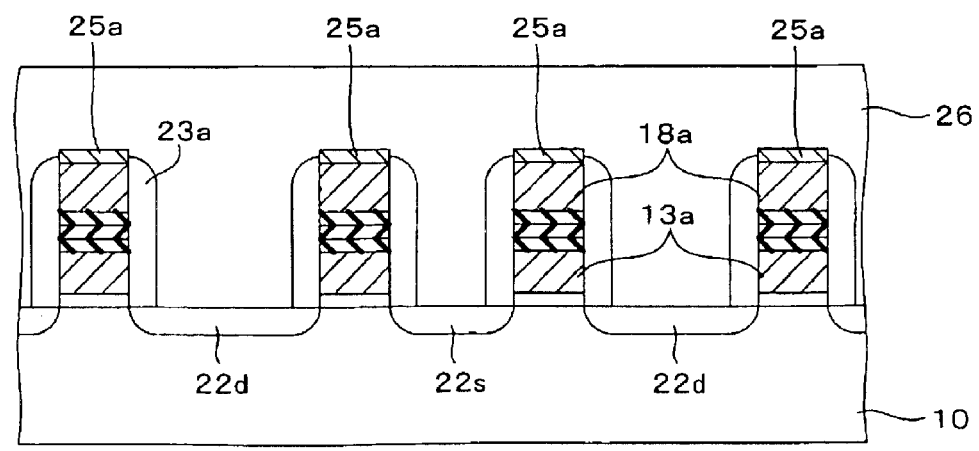

Thereafter, a metal film of chromium, tungsten or the like is formed over the entire upper surface of the semiconductor substrate 10, and heat treatment is given thereto. Thus, metal atoms in the metal film and silicon atoms of the gate electrode and the source/drain layer are reacted to each other, and as shown in FIGS. 20A to 20C, silicide films 25a and 25b are formed on the control gate 18a and the gate electrode 18b and a silicide film 25c is formed on the surface of the source/drain layer 24b in the peripheral circuit formation portion. Thereafter, the non-reacted metal film is removed by etching.

Figure 21A:
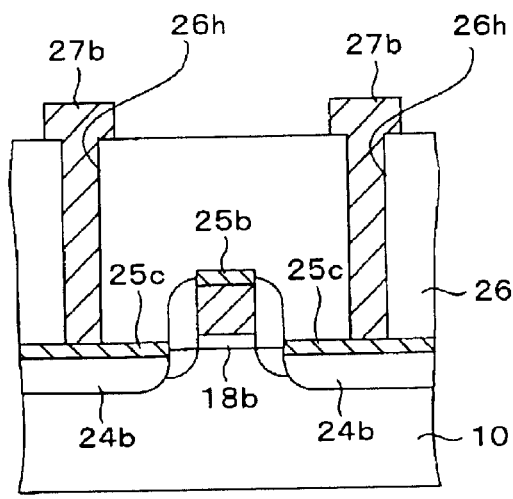
FIGS. 21A to 21C are cross-sectional views (Step 8) showing the method of manufacturing a semiconductor device (flash memory) according to the embodiment of the present invention.
Figure 21B:
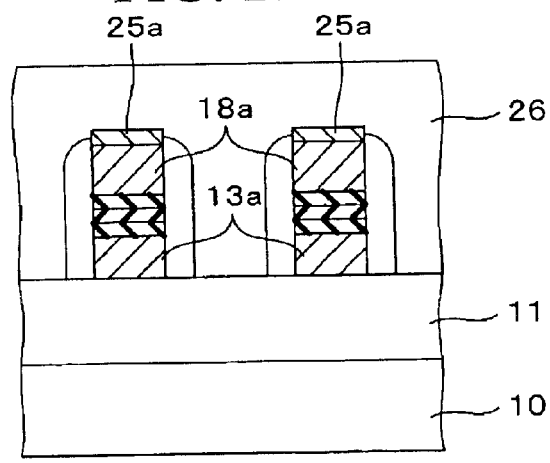
Figure 21C:
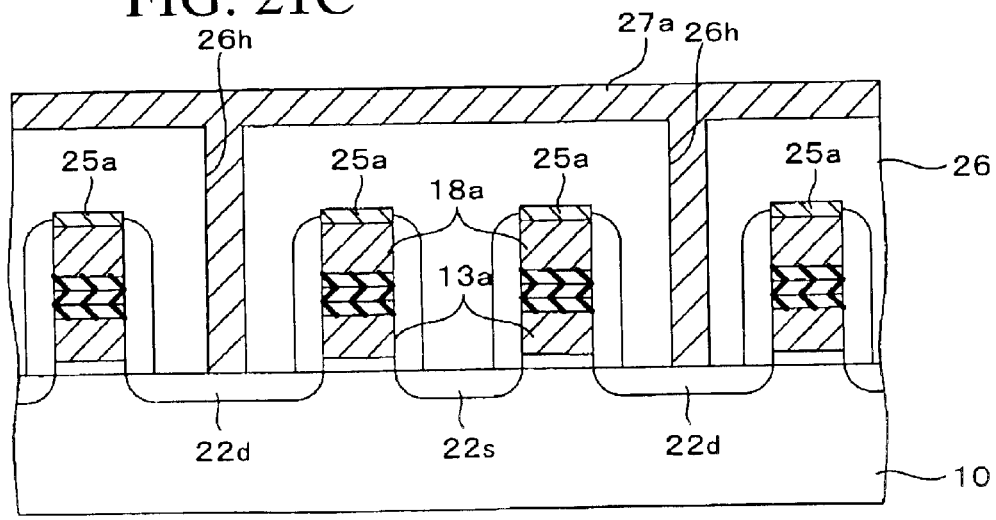

Subsequently, as shown in FIG. 13C, $SiO_2$ is deposited over the entire upper surface of the semiconductor substrate 10 by the CVD method, thus forming an interlayer insulating film 26. By the photolithography method, contact holes 26h are formed in the interlayer insulating film 26. Thereafter, by forming a metal film over the entire upper surface of the semiconductor substrate 10 and patterning this metal film, as shown in FIGS. 21A to 21C, bit lines 27a extending in the Y direction are formed in the memory cell formation portion, and wirings 27b are formed in the peripheral circuit formation portion. The bit lines 27a are electrically connected to the drain layers 22d in the memory cell formation portion through the contact holes 26h, and the wirings 27b are electrically connected to the source/drain layers 24b in the peripheral circuit formation portion through the contact holes 26h and the silicide films 25c. In such a manner, a flash memory is completed.

According to the embodiment, in the steps shown in FIGS. 17A to 17C, the silicon nitride film 20 is removed by dry etching using a mixed gas of $O_2$ and either of $CH_3F$ and $CH_2F_2$. In this event, a flow rate of $O_2$ is set to be 5 to 7 times greater than that of $CH_3F$, $CH_2F_2$ or a mixed gas thereof and a pressure inside a reaction chamber is maintained in the range of 80 to 100 mTorr (10.6 to 13.3 Pa). Thus, side-etching of the silicon nitride layer 15 of the intermediate insulating film is avoided. As a result, electrical properties between the floating gate 13a and the control gate 18a are stabilized, thereby obtaining an effect that characteristic changes in a write voltage and a read voltage of a memory cell are prevented. Moreover, in the embodiment, since the silicon nitride film 20 is etched under the foregoing condition, etching of the silicon oxide film 12 covering the surface of the semiconductor substrate is suppressed. Thus, since the introduction of carbon, its compound and the like in the etching gas into the substrate surface is avoided, the silicide film 25c is uniformly formed in the later step of forming the silicide film 25c. Accordingly, electrical connections between the source/drain layers 24b and the wirings 27b become favorable.

Furthermore, according to the present invention, since the etching of the element isolation film 11 is avoided when the silicon nitride film 20 is etched, increase in an aspect ratio between the control gates 18a in forming the interlayer insulating film 26 is avoided. Thus, the generation of pores between the control gates 18a is prevented, thereby obtaining an effect that reliability of a flash memory is improved.

Note that, though the description was made for the case of applying the present invention to the method of manufacturing a flash memory in the foregoing embodiment, the present invention is not limited to the method of manufacturing a flash memory by the above description. The present invention can be applied to various methods of manufacturing a semiconductor device, which include a step of selectively etching the silicon nitride film with respect to the silicon oxide film.

What is claimed is:

1. A method of manufacturing a semiconductor device having a floating gate memory cell, comprising the steps of:

forming a silicon oxide film on a semiconductor substrate;

forming a stacked gate structure that consists of a floating gate, an intermediate insulating film, a control gate and a silicon nitride film, on said silicon oxide film;

introducing impurities into a surface of said semiconductor substrate via said silicon oxide film using said silicon nitride film as a mask; and removing said silicon nitride film by etching in the state that said silicon oxide film is exposed, said etching comprising etching with an etchant comprising $O_2$ and one or more members selected from the group consisting of $CH_3F$ and $CH_2F_2$, such that a flow rate of said $O_2$ is at least five times greater than a flow rate of said one or more members selected from the group consisting of $CH_3F$ and $CH_2F_2$, and subjecting said silicon nitride film to a pressure of from 80 mTorr to 100 mTorr.

2. The method of manufacturing a semiconductor device according to claim 1, wherein a ratio of a space that said silicon nitride film occupies to said semiconductor substrate, is in the range of 20 to 70%.

3. The method of manufacturing a semiconductor device according to claim 1, further comprising applying an electric power of from 0.478 to 0.796 W/cm$^2$ per unit area of said silicon nitride film.

4. The method of manufacturing a semiconductor device according to claim 1, wherein an etching selectivity of the silicon nitride film to the silicon oxide film is 15 or more.

5. The method of manufacturing a semiconductor device according to claim 1, wherein said intermediate insulating film comprises a first silicon oxide layer, a silicon nitride layer formed on said first silicon oxide layer, and a second silicon oxide layer formed on said silicon nitride layer.

6. The method of manufacturing a semiconductor device according to claim 1, wherein a magnetron etching device of a parallel plane type is used.

* * * * *